United States Patent
Card et al.

(10) Patent No.: US 7,211,470 B2
(45) Date of Patent: May 1, 2007

(54) METHOD AND APPARATUS FOR DEPOSITING CONDUCTIVE PASTE IN CIRCUITIZED SUBSTRATE OPENINGS

(75) Inventors: Norman A. Card, Lockwood, NY (US); John M. Lauffer, Waverly, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 11/216,133

(22) Filed: Sep. 1, 2005

(65) Prior Publication Data

US 2007/0048897 A1    Mar. 1, 2007

(51) Int. Cl.
*H01L 21/00* (2006.01)
(52) U.S. Cl. ............... 438/119; 257/E21.514
(58) Field of Classification Search ........... 438/106, 438/119; 29/852
See application file for complete search history.

(56) References Cited

U.S. PATENT DOCUMENTS

| | | | |
|---|---|---|---|
| 5,133,120 A | 7/1992 | Kawakami et al. | |
| 5,191,709 A | 3/1993 | Kawakami et al. | |
| 5,287,806 A | 2/1994 | Nanzai et al. | |
| 5,925,187 A | 7/1999 | Freeman et al. | |
| 6,015,520 A | 1/2000 | Appelt et al. | |
| 6,272,984 B1 | 8/2001 | Kato et al. | |
| 6,282,782 B1 * | 9/2001 | Biunno et al. | 29/852 |
| 6,286,422 B1 | 9/2001 | Lin et al. | |
| 6,493,861 B1 | 12/2002 | Li et al. | |
| 6,630,630 B1 | 10/2003 | Maezawa et al. | |
| 6,630,743 B2 | 10/2003 | Magnuson et al. | |
| 6,631,558 B2 | 10/2003 | Burgess | |
| 6,631,838 B2 | 10/2003 | Kim et al. | |
| 6,638,690 B1 | 10/2003 | Meier et al. | |
| 6,638,858 B2 | 10/2003 | Cheng | |
| 6,809,269 B2 | 10/2004 | Fuller, Jr. et al. | |
| 6,828,514 B2 | 12/2004 | Chan et al. | |
| 6,840,169 B2 | 1/2005 | Amir | |
| 6,905,589 B2 | 6/2005 | Egitto et al. | |

* cited by examiner

*Primary Examiner*—W. David Coleman
(74) *Attorney, Agent, or Firm*—Hinman, Howard & Kattell, LLP; Lawrence R. Fraley

(57) ABSTRACT

A method and apparatus for depositing conductive paste in openings of a circuitized substrate such as a multilayered printed circuit board to produce effective conductive thru-holes capable of being electrically coupled to selected conductive layers of the substrate. The invention comprises using vacuum to draw from the underside of the substrate while substantially simultaneously applying the paste onto the substrate's opposing surface. One example of means for accomplishing such paste application is a squeegee, and in one embodiment, two such squeegees may be used. A porous member is used to engage the substrate's undersurface during the vacuum draw, this member being positioned atop a base vacuum member through which the vacuum is drawn.

23 Claims, 2 Drawing Sheets

METHOD AND APPARATUS FOR DEPOSITING CONDUCTIVE PASTE IN CIRCUITIZED SUBSTRATE OPENINGS

TECHNICAL FIELD

This invention relates to circuitized substrates such as printed circuit boards and cards, as well as laminate carriers adapted for having one or more semiconductor chips coupled thereto (such packages also referred to simply as chip carriers). Most particularly, the invention relates to such substrates of the multilayered variety in which a plurality of individual dielectric and conductive layers are utilized, with conductive thru-holes used to provide desired electrical coupling between selected ones of the conductive layers.

BACKGROUND OF THE INVENTION

In the manufacture of such substrates, it has become commonplace to produce printed circuitry on both sides of the rigid or flexible substrate, in addition to within the substrate as mentioned above. Of increased importance is the manufacture of multilayered substrates, and particularly printed circuit boards (PCB's), the latter being the most common types of substrates sold today in view of increased operational demands for such products. In these products, the substrate typically consists of parallel, planar, alternating innerlayers of insulating substrate (also referred to as dielectric) material and conductive metal. Known such dielectric materials include fiberglass-reinforced epoxy resin (also referred to in the field as, simply, "FR4"), polytetrafluoroethylene (e.g., Teflon, a trademark of E.I. DuPont deNemours & Company), Driclad material (a trademark of Endicott Interconnect Technologies, Inc., the assignee of this invention), etc. The exposed outer sides of the laminated structure are often provided with circuit patterns as with double-sided boards, and the metal inner layers typically contain circuit patterns, except in the case of internal power planes which are substantially solid, albeit also containing clearance openings or other openings if desired.

In double-sided and multilayered circuitized substrates, it is necessary to provide conductive interconnections between the various conductive layers or sides of the product. This is commonly achieved by providing metallized, conductive thru-holes in the board which communicate with the opposite sides and selected layers requiring electrical interconnection. For some applications, it is desired that electrical connection be made with almost if not all of the conductive layers. In such a case, conductive thru-holes are provided through the entire thickness of the board. For these, as well as other applications, it is often desired to also provide electrical connection between the circuitry on one face of the board and only one or more of the inner circuit layers. In those cases, "blind vias", passing only part way through the board, are provided. In still another case, such multilayered boards often require internal "vias" which are located entirely within the board's structure and covered by external layering, including both dielectric and conductive. Such internal "vias" are typically formed within a sub-part structure of the final board and then combined with other layers during final lamination of the board. For purposes of this application, the terms "thru-hole" is meant to include conductive thru-holes that pass entirely through the board (also referred to in the printed circuit board field as plated-thru-holes or PTHs), "blind vias" which extend from an external surface of the board into a specified conductive layer of the board, as well as "internal vias" which are "captured" by the board's outer layers.

To provide the desired circuit pattern(s) for the board, the art has developed a variety of manufacturing processes, many of which fall into the broad categories of "subtractive" or "additive" techniques. Common to subtractive processes is the need to etch away (or subtract) metal to expose substrate surface in areas where no circuitry is desired. Additive processes, on the other hand, begin with exposed substrate surfaces (or thin commoning metallization layers for additive electroplate) and build up thereon of metallization in desired areas, the desired areas being those not masked by a previously-applied pattern of plating resist material (e.g., called photo-resist material in the printed circuit board field). Both of said processes involve what is referred to as photolithographic processing in which desired patterns are defined using such photo-resist, which is exposed and "developed: to subsequently allow etching away of undesired metallurgy. Typically, the individual conductive layers are "personalized" using such photolithographic processing with the desired circuit patterns thereon and then laminated together with other such conductive layers with the dielectric layers located there-between. Lamination is a well-known PCB manufacturing process involving elevated temperatures and pressures and further description is not considered essential here. If outer circuit patterns are desired, the substrate includes outer conductive layers which are similarly "personalized".

Typically, thru-holes are drilled (including mechanically or more recently using lasers) or punched into or through the board at desired locations. In the case of internal vias, these are formed within the desired individual layers prior to lamination. In the case of blind vias, these are formed from a desired outer surface, usually after final lamination. In the case of PTH's, these are preferably formed from a desired outer surface of the completely laminated structure and extend entirely through the structure to the opposite side. Once such holes are initially provided (drilled or punched), the hole walls (of the dielectric material in the substrate) may then be metallized, generally by utilization of electroless metal depositing techniques, albeit other deposition processes are also known in the field. Such a process results in one or more thin layers of conductor (usually copper) on the internal walls of the holes, this/these conductive layer(s) in turn being electrically coupled to the selected internal and external conductive layers.

It is also known with respect to the formation of conductive thru-holes in circuitized substrates such as PCB's and chip carriers to utilize conductive paste within the openings, either in combination with the already plated conductor surfaces or simply as the only conductive medium for the length of the thru-hole. Several known examples of such conductive pastes exist, one known example being sold under the product name "TH9910" by Tatsuta System Electronics Company, of Osaka, Japan. This paste includes a copper powder filler and a phenolic resin binder. Pastes including silver powders are also known, one example being sold under the product name "ED2000" by Electra, of Tonbridge, England. As defined herein, the present invention provides a new and unique method and apparatus for providing such deposition in a manner readily adaptable to mass production.

Examples of methods of making PCB's, including providing same with such thru holes, are shown and described in the following U.S. Letters Patents:

U.S. Pat. No. 6,015,520 Method For Filling Holes in Printed Wiring Boards

U.S. Pat. No. 6,493,861 Interconnected Series of Plated Through Hole Vias and Method of Fabrication Therefor U.S. Pat. No. 6,630,630 Multilayer Printed Wiring Board and Its Manufacturing Method U.S. Pat. No. 6,630,743 Copper Plated PTH Barrels and Methods For Fabricating U.S. Pat. No. 6,631,558 Blind Via Laser Drilling System U.S. Pat. No. 6,631,838 Method For Fabricating Printed Circuit Board U.S. Pat. No. 6,638,690 Method For Producing Multi-Layer Circuits U.S. Pat. No. 6,638,858 Hole Metal-Filling Method U.S. Pat. No. 6,809,269 Circuitized Substrate Assembly And Method of Making Same U.S. Pat. No. 6,828,514 High Speed Circuit Board And Method Of Making U.S. Pat. No. 6,905,589 Circuitized Substrate And Method of Making Same As stated, the present invention defines a new and unique process for depositing conductive paste within circuitized substrate openings to produce a final substrate having the beneficial aspects thereof. The following U.S. Letters Patents describe various processes and apparatus for depositing pastes:

U.S. Pat. No. 5,133,120 Method of Filling Conductive Material Into Through Holes of Printed Wiring Board U.S. Pat. No. 5,191,709 Method of Forming Through-Holes In Printed Wiring Board U.S. Pat. No. 5,287,806 Apparatus and System For Screen Printing of Solder Paste Onto Printed Circuit Boards U.S. Pat. No. 5,925,187 Apparatus For Dispensing Flowable Material U.S. Pat. No. 6,272,984 Squeegee For Screen Printing and Screen Printing Method U.S. Pat. No. 6,286,422 Method and Apparatus For Dispensing Viscous Material U.S. Pat. No. 6,840,169 Methods For Manufacturing Printed Circuit Boards Using a Partial Printing Process and Apparatus The present invention provides a method and apparatus for accomplishing conductive paste deposition within circuitized substrates in a manner considered more expedient than those mentioned above, both of which are considered readily adapted for mass production. It is believed that such a method and an apparatus for accomplishing said method will represent significant advancements in the art.

DESCRIPTION OF THE INVENTION

It is, therefore, a primary object of the present invention to enhance the circuitized substrate art by providing a new and unique method of making such substrates.

It is another object of the invention to provide such a process and resulting product in which several conductive thru-holes are formed to interconnect various conductive layers of the board in a new and expeditious manner.

It is still another object of the invention to provide such a process which can be implemented using conventional printed circuit board technologies and thus performed with little or no increased cost over conventional techniques.

According to one aspect of the invention, there is provided a method of depositing conductive paste within openings of a circuitized substrate, the method comprising providing a vacuum base member having a porous member positioned thereon, providing a circuitized substrate having first and second opposing surfaces and a plurality of openings therein extending substantially through the circuitized substrate, positioning the substrate having the openings therein on the porous member such that the first opposing surface of the substrate rests on this porous member, and applying a quantity of conductive paste across the second opposing surface of the substrate while substantially simultaneously applying a vacuum through the porous member to substantially completely fill selected ones of the openings with paste.

According to another aspect of the invention, there is provided an apparatus for depositing conductive paste within openings of a circuitized substrate, the apparatus comprising a vacuum base member, a porous member positioned on the vacuum base member, a member adapted for drawing conductive paste across a circuitized substrate having a plurality of openings therein when this substrate is positioned on the porous member, and means adapted for applying a vacuum on the vacuum base member to draw gas through the porous member while substantially simultaneously applying a quantity of conductive paste onto the circuitized substrate using the member adapted for drawing the paste across the substrate to substantially completely fill selected ones of the openings with the paste.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

Figure 1:
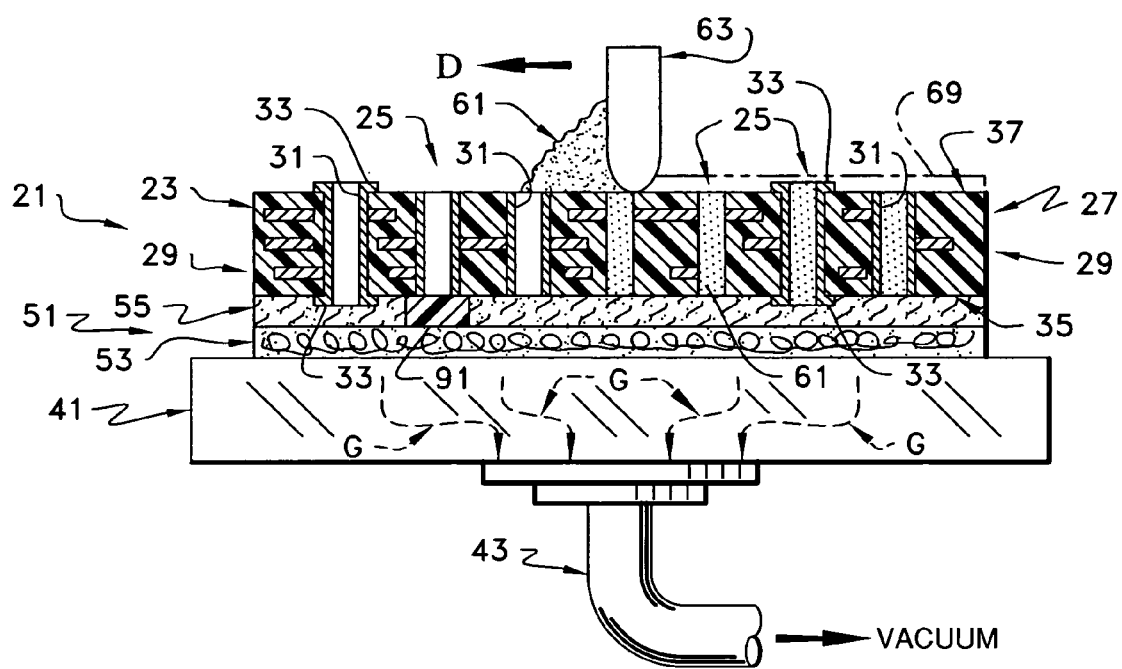
FIG. 1 is a side elevational view, in section, showing an apparatus adapted for depositing conductive paste in substrate openings, according to one embodiment of the invention.

In FIG. 1, there is shown an apparatus 21 for depositing conductive paste within openings 25 of a circuitized substrate 23, one example of such a substrate being a multilayered printed circuit board (PCB). As shown, substrate 23 includes a plurality of dielectric layers and conductive layers. Three such conductive layers are shown internally of the substrate in FIG. 1, but this is not meant to limit the invention as substrate 23 may include fewer or more, depending on the operational requirements for the finished substrate. Dielectric layers of conventional material (e.g., the aforementioned "Driclad" material) may be used, while conductive layers of conventional copper material may also be used. The conductive layers may function as signal, power and/or ground layers, as is known. As understood, selected ones of the openings 25 are designed for being electrically coupled to corresponding, selected ones of the conductive layers, and examples of such connections are understood from the drawings, i.e., the opening to the far right is coupled to the first and second (from the top) internal conductive layers but not to the lower internal conductive layer. A multitude of combinations and permutations are possible for such connections and those shown are for illustration purposes only. Some openings, as shown, may include an internal conductive layer 31, including where the layers terminate in upper and/or lower "lands" (33) on the first and second opposing surfaces 35 and 37, respectively, of the substrate. Such "lands" may also form part of upper circuitry (the remainder not shown) which may also be formed (e.g., using the aforementioned photolithographic processing) on both upper and lower surfaces 35 and 37. In addition, the openings 25 may not include any internal conductive metallurgy, as also shown (the third and fourth openings from the right being shown as not including any internal surface metallurgy).

Figure 2:
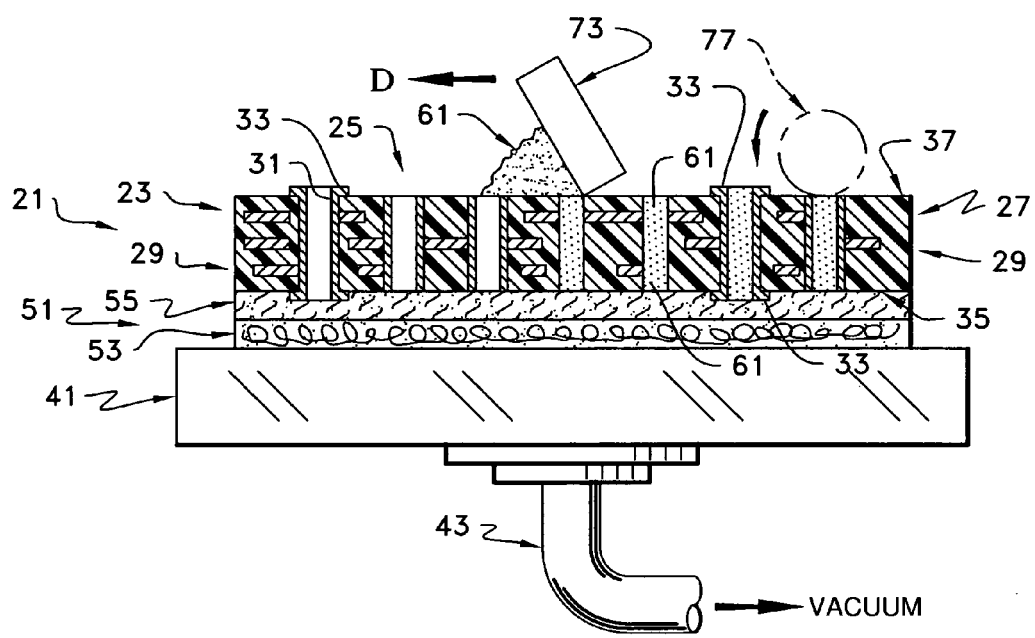
FIG. 2 is a side elevational view, also in section, of an apparatus adapted for depositing conductive paste in substrate openings, according to another embodiment of the invention.

Typically, the openings 25 are initially formed by drilling (including mechanically or, more recently, using lasers) or punched through the substrate at the desired locations. If added plating is desired, this is now performed, typically using an electro-less plating operation as described above. The substrate in FIGS. 1 and 2 is shown to include at least three types of openings which are capable of being thru-holes for providing the desired interconnections taught herein (such openings are understood to become conductive thru-holes when rendered conductive, including by the addition of the described plated internal layers). It is understood that in many applications, substrate 23 will include only one type of such openings, e.g., those including an internal conductive layer with opposed "lands." The various openings shown herein are thus representative of the fact that the invention is capable of filling all of these types, either singularly or in combination, within various substrate configurations. In one embodiment, surface 37 and/or surface 35 in FIGS. 1 and 2 may include thereon a continuous conductive layer (not shown) to facilitate paste filling and clean-up. Optionally, one or both of these surfaces may include a layer of photo-resist or other masking material (not shown) to aid in paste filling, especially of selected openings only.

It should also be understood that substrate 23 is representative of only one form of substrate in which the openings thereof may be filled with paste in accordance with the teachings herein. For example, in simplest form, substrate 23 need only include one dielectric layer with opposing conductive layers on the outer surfaces thereof. The openings (when conductive) will then connect the opposing conductive layers at desired locations. This relatively simple structure may then be laminated together with other such structures (including those with more dielectric and conductive layers) to form a larger multilayered substrate, such as that shown in FIGS. 1 and 2, for example. The invention is thus not limited to filling only openings with multilayered structures such as shown in the drawings.

Apparatus 21 of FIG. 1 is shown to include a base vacuum member 41 which includes a plurality of gas passages therein through which gas will pass (four such passages are represented by the dashed lines G). Such lines are not shown in FIG. 2. In one example, member 41 may include as many as two thousand such passages. Vacuum is drawn through member 41 using a conventional vacuum pump (not shown) which draws gas through at least one connecting outlet 43 on the undersurface of the member. Clearly, the invention is not limited to only one outlet as many more are possible, and such outlets may also be positioned along the sides of the member (e.g., for space savings) rather than on the underside as shown. In one embodiment, member 41 is comprised of stainless steel.

Atop member 41 is a porous member 51, which, in one embodiment of the invention, includes two layers 53 and 55. It is understood that in the broadest aspects of this invention, member 51 need only be of single layer construction or, alternatively, even of more than the two layers shown and described herein. In the FIG. 1 embodiment, the first layer 53 is preferably a metal mesh member, the preferred metal being stainless steel, while the second layer 55 is of less porosity, and preferably of paper or similar fiber material. Other materials for these layers are readily possible and the invention is not limited to these particular ones. When apparatus 21 is in operation, layer 55 will serve to substantially prevent paste from exiting the selected openings of substrate 23 into which the paste is initially deposited, while the more porous layer 53 facilitates vacuum draw on the higher porosity layer by providing a broader base from which vacuum can be drawn into the base vacuum member 41. In the broadest aspects of the invention, it may be possible to only utilize either the first or second layer. In the example shown, layer 53 may have a thickness of about two mils (a mil being 0.001 inch) to about ten mils while the upper layer 55 may have a thickness of about one mil to about five mils. In this combination, a vacuum force of from about five pounds per square inch (PSI) to about fifty PSI may be used, with the conductive paste being dispensed at a rate of from about two grams (gms.) per second to about fifty gms per second. Such dispensing is described in greater detail below. These vacuum forces and paste dispense rates may vary, of course, depending on the substrate opening diameters and the corresponding substrate thicknesses (see the Examples below). For example, substrates with lesser thicknesses and openings of larger diameters may not require as high vacuum forces or paste dispense rates, compared to substrates of greater thicknesses and smaller opening diameters.

The aforementioned vacuum is applied substantially simultaneously with the deposition of conductive paste (61) applied onto the upper opposite surface 37 of substrate 23. As shown in FIG. 1, the preferred deposition is accomplished using a squeegee 63 which forces the paste 61 across the upper surface (in direction D) after it is initially deposited at one end of this surface. Preferred initial deposition is accomplished using a conventional paste dispense nozzle (not shown). In FIG. 1, squeegee 63 is preferably a "ballnose" squeegee. Various ballnose squeegees are known in the commercial printing art. In one embodiment, a squeegee having a durometer hardness of from about sixty Shore A hardness to about ninety Shore A hardness and made of high density polyurethane may be used. As seen in FIG. 1, squeegee 63 is oriented at a ninety degree "angle of attack" relative to the upper surface 37. Being of the ballnose type, the forward engaging face of the squeegee is rounded.

Squeegee 63 may move in direction D as shown while substrate 23 (and vacuum plate member 41 and porosity member 51) remain stationary, or, alternatively, the squeegee may remain stationary while the substrate and supporting members 41 and 51 move (opposite direction D) underneath. In still another embodiment, the squeegee and members 41 and 51 may each move, in opposing directions of course. Regardless of which of these three forms of motion is chosen, the end result is that the conductive paste is applied across the entire upper surface 37. In one embodiment of the invention, use of a ballnose squeegee resulted in a thin layer of paste remaining behind the squeegee on the upper surface 37. This layer is shown in exaggerated form by the numeral 69 in FIG. 1. When this occurred, use of a second squeegee, shown as numeral 73 in FIG. 2, was undertaken. Squeegee 73 is of the "straight-edge" type, or of substantially rectangular cross-section, and, when moved across upper surface 37 following first squeegee 63, effectively removed ("cleaned") substantially all of the remaining paste and forced this into openings 25. Vacuum was applied during this second squeegee operation, with the porosity member 51 remaining in place. Squeegee 73 may be of the same material as squeegee 63, but is preferably harder if used as a sole element for paste application. Although use of two squeegees has proven successful when using the squeegees of the type shown in the order defined, it is possible to successfully deposit paste within openings 25 while using only one squeegee, provided suitable vacuum forces and squeegee pressures are applied. For example, use of only the rectangular squeegee 73 may be possible. Further, although only one direction (D) is shown for squeegee movement, it may also be desirable to reverse the squeegee(s) and require same to move in a direction opposite to that shown. It is also possible to combine various movements, e.g., move squeegee 63 back and forth across surface 37 and then move squeegee 73 only in direction D. Other forms of motion are possible and further description is not deemed necessary.

Following paste deposition within openings 25, it may be desirable to "polish" upper surface 37, such as by using a mechanical or chemical polisher (represented in phantom in FIG. 2 by the numeral 77). Examples of such polishers are known for use in the PCB art, and further description is not needed. Importantly, the chemical agent must be selected so as not to adversely affect the chemical properties of the deposited paste. By way of example, a chemical agent comprised of cupric chloride may be used when removing a silver filled conductive paste material.

It is possible in one embodiment of the invention to provide substrate 23 with its dielectric material (e.g., "FR4") in what is referred to as an uncured state. As such, the method defined herein may include heating of the substrate, having the paste therein, to an elevated temperature and for a sufficient time period so as to "B-stage" the dielectric. In one example, substrate 23 may be exposed to temperatures within the range of from about ninety degrees Celsius (C) to about one hundred and fifty degrees C., for a time period of from about five minutes to about forty-five minutes. The resulting substrate is now at "B-stage" (a known stage for dielectric materials in the PCB industry), and ready for further processing, including lamination with other similar staged substrates. Such dielectric curing will preferably occur prior to the aforementioned polishing operation.

Curing of paste 61 is required in the case of most pastes of conventional type, so it is necessary to heat the substrate to accomplish this. Such paste cure may occur simultaneously with the above dielectric cure, or may initially begin as a result of same and then finally cure with application of additional heat over an extended period of time. This cure may also occur as the only substrate heating operation if the dielectric materials therein are of sufficient cure already. Following dielectric cure to "B-stage" in one example, it may be necessary to further heat the substrate having the paste therein for a time period of from about thirty minutes to about one-hundred and twenty minutes at a temperature within the range of from about one-hundred and fifty degrees C. to about two-hundred and twenty degrees C. Such additional curing is typically needed for pastes having epoxy or other thermoset materials as elements thereof. According to one embodiment of this invention, a paste sold under the product name CB-100, and available from DuPont, of Research Triangle Park, N.C., USA, may be successfully utilized. Another example of a conductive paste for use with the invention includes one sold under the product name. Ablebond 8175, by Emerson and Cuming, of Billerica, Mass.

In yet another embodiment of the invention, it may be possible to form the outer conductive circuitry (including forming the lands) on the upper surface 37 simultaneously with the paste deposition process. For example, photo-resist such as described above may be applied over a non-circuitized upper conductive layer including of course openings extending therethrough at designated locations. This upper layer may be applied using conventional plating, e.g., electro-less plating. The photo-resist may then be exposed and "developed" (selected portions removed) using conventional photolithographic processing to define the ultimate circuitry on surface 37. The remaining photo-resist may eventually be removed following the aforementioned chemical polishing operation. In such a case, paste cure may also occur following polish.

A final step in making the circuitized substrate shown herein may be to provide a "cap" plating on the substrate's outer surfaces, where desired. Such plating serves to cover the conductive paste and provide a planar, solderable surface for component attach directly above the thru-hole(s) and may be accomplished using conventional seed, electroless copper and electrolytically plated copper, all of which are known in the industry. For certain conductive fill materials (e.g. copper-filled conductive paste), seed and electroless copper may not be required, while direct electroplated copper may be. When "cap" plating is utilized, the preferred time of filling is prior to etching of the external conductor surface; rather, the holes are filled with a solid external conductor surface, and external lands are thus created in the solid external conductor and "cap" plating layer simultaneously. The thus defined external lands may further be plated with additional metallurgy (e.g. electroless nickel, immersion gold and/or immersion silver) as desired.

The following represent examples of filling substrates using the teachings of the invention.

EXAMPLES

Three substrates of varying thickness were provided with openings of varying diameters, and all were successfully filled with conductive paste using the teachings herein. In one example, openings of twelve mil diameter were filled in substrates having a thickness of about one-hundred mils. In another example, six mil openings in forty mil thick substrates were filled, while in a third example, openings as small as two mil diameter in a substrate having a thickness of only about seven mils were successfully filled. These examples illustrate the ability of the invention to fill openings in substrates of widely varying thicknesses and with widely varying opening diameters. In the case of the last example, this further illustrates the unique ability of the instant invention to fill openings in high density substrates.

Thus there has been shown and described a new and unique method and apparatus for filling substrate openings of various sizes with conductive paste so as to enhance the conductivity of such openings in the final product. The method taught herein may be accomplished in a facile manner using apparatus which is not of complex design, thus assuring reduced costs associated with the implementation thereof. The invention thus represents a significant improvement in the art.

While there have been shown and described what are at present the preferred embodiments of the invention, it will be obvious to those skilled in the art that various changes and modifications may be made therein without departing from the scope of the invention as defined by the appended claims. For example, the present invention has been defined in one context in which the formed resulting structure may serve as a base for subsequently applied dielectric and/or conductive layers to build a larger, final structure. Still further, it is possible to only selectively fill certain openings and not fill others. In such a case, layer 55 may include a relatively solid member (91, in FIG. 1, not shown in FIG. 2) as part thereof to prevent vacuum draw through an opening which is aligned with the member (this being the second from the left in FIG. 1). Some paste may still be deposited within the upper portion the opening so "blocked", but this may be readily removed, e.g., by a secondary vacuum device (not shown) which will draw the paste upwardly from the substrate.

What is claimed is:

1. A method of depositing conductive paste within openings of a circuitized substrate, said method comprising:
    providing a vacuum base member having a porous member positioned thereon;
    providing a circuitized substrate having first and second opposing surfaces and a plurality of openings therein extending substantially through said circuitized substrate;
    positioning said circuitized substrate having said plurality of openings therein on said porous member positioned on said vacuum base member such that said first opposing surface of said circuitized substrate rests on said porous member; and
    applying a quantity of conductive paste across said second opposing surface of said circuitized substrate while substantially simultaneously applying a vacuum through said porous member to substantially completely fill selected ones of said plurality of openings within said circuitized substrate with said conductive paste, said applying of said quantity of conductive paste being accomplished using a first squeegee drawn across said second opposing surface of said circuitized substrate in a first direction and a second squeegee drawn across said second opposing surface of said circuitized substrate also in said first direction and after said first squeegee is drawn across said second opposing surface.

2. The method of claim 1 wherein said a first squeegee is a ball nose squeegee.

3. The method of claim 1 further including polishing said second opposing surface after said applying of said quantity of conductive paste.

4. The method of claim 1 further including drawing said first squeegee across said second opposing surface of said circuitized substrate in a second direction after said first squeegee is drawn across said second opposing surface of said circuitized substrate in said first direction.

5. The method of claim 1 wherein said conductive paste is deposited at a rate of from about two grams per second to about fifty grams per second.

6. The method of claim 1 further including plating said selected ones of said openings with metal prior to said applying of said conductive paste.

7. The method of claim 1 further including heating said circuitized substrate having said conductive paste substantially completely filling said selected ones of said openings to substantially cure said conductive paste.

8. The method of claim 2 wherein said second squeegee is a rectangular squeegee.

9. The method of claim 8 wherein said first squeegee and said second squeegee are each comprised of high density polyurethane.

10. The method of claim 5 wherein said vacuum is drawn at a pressure of from about five pounds per square inch to about fifty pounds per square inch.

11. An apparatus for depositing conductive paste within openings of a circuitized substrate, said apparatus comprising:
    a vacuum base member;
    a porous member positioned on said vacuum base member and including first and second layers, said first layer comprising a mesh member and having a greater porosity than said second layer;
    a member adapted for drawing conductive paste across a circuitized substrate having a plurality of openings therein when said circuitized substrate is positioned on said porous member; and
    means adapted for applying a vacuum on said vacuum base member to draw gas through said porous member while substantially simultaneously applying a quantity of conductive paste onto said circuitized substrate using said member adapted for drawing said conductive paste across said circuitized substrate to substantially completely fill selected ones of said plurality of openings within said circuitized substrate with said conductive paste.

12. The apparatus of claim 11 wherein said mesh member is comprised of metal.

13. The apparatus of claim 11 wherein said second layer is a paper member.

14. The apparatus of claim 11 wherein said means adapted for applying a vacuum on said vacuum base member to draw gas through said porous member comprises a vacuum pump.

15. The apparatus of claim 1 wherein said metal of said mesh member is stainless steel.

16. An apparatus for depositing conductive paste within openings of a circuitized substrate, said apparatus comprising:
    a vacuum base member;
    a porous member positioned on said vacuum base member;
    a member adapted for drawing conductive paste across a circuitized substrate having a plurality of openings therein when said circuitized substrate is positioned on said porous member, said member comprising a first squeegee;
    a second squeegee adapted for drawing conductive paste remaining on said substrate following said drawing of said conductive paste by said first squeegee; and
    means adapted for applying a vacuum on said vacuum base member to draw gas through said porous member while substantially simultaneously applying a quantity of conductive paste onto said circuitized substrate using said member adapted for drawing said conductive paste across said circuitized substrate to substantially completely fill selected ones of said plurality of openings within said circuitized substrate with said conductive paste.

17. The apparatus of claim 16 wherein said first squeegee is a ball nose squeegee and said second squeegee is a rectangular squeegee.

18. The apparatus of claim 16 wherein said means adapted for applying a vacuum on said vacuum base member to draw gas through said porous member comprises a vacuum pump.

19. The apparatus of claim 17 wherein said first squeegee and said second squeegee are each comprised of high density polyurethane.

20. An apparatus for depositing conductive paste within openings of a circuitized substrate, said apparatus comprising:
- a vacuum base member;
- a porous member positioned on said vacuum base member;
- a member adapted for drawing conductive paste across a circuitized substrate having a plurality of openings therein when said circuitized substrate is positioned on said porous member;
- means adapted for applying a vacuum on said vacuum base member to draw gas through said porous member while substantially simultaneously applying a quantity of conductive paste onto said circuitized substrate using said member adapted for drawing said conductive paste across said circuitized substrate to substantially completely fill selected ones of said plurality of openings within said circuitized substrate with said conductive paste; and
- polishing means for polishing said second opposing surface of said circuitized substrate following said applying of said quantity of conductive paste.

21. The apparatus of claim 20 wherein said means adapted for applying a vacuum on said vacuum base member to draw gas through said porous member comprises a vacuum pump.

22. The apparatus of claim 20 wherein said polishing means comprises a mechanical polisher.

23. The apparatus of claim 20 wherein said polishing means comprises a chemical polisher.

* * * * *